(12) United States Patent
Bhardwaj et al.

(10) Patent No.: US 7,491,649 B2
(45) Date of Patent: Feb. 17, 2009

(54) PLASMA PROCESSING APPARATUS

(75) Inventors: Jyoti Kiron Bhardwaj, Bristol (GB); Leslie Michael Lea, Didcot (GB)

(73) Assignee: Surface Technology Systems PLC, Gwent (GB)

( * ) Notice: Subject to any disclaimer, the term of this patent is extended or adjusted under 35 U.S.C. 154(b) by 185 days.

(21) Appl. No.: 11/080,964

(22) Filed: Mar. 16, 2005

(65) Prior Publication Data

US 2005/0159010 A1    Jul. 21, 2005

Related U.S. Application Data

(62) Division of application No. 09/601,958, filed as application No. PCT/GB99/04168 on Dec. 10, 1999, now abandoned.

(30) Foreign Application Priority Data

| Dec. 11, 1998 | (GB) | ................... 9827196.8 |
| Jan. 29, 1999 | (GB) | ................... 9901869.9 |
| Apr. 14, 1999 | (GB) | ................... 9908459.2 |

(51) Int. Cl.
*H01L 21/302* (2006.01)

(52) U.S. Cl. .................. 438/707; 438/706; 438/710; 438/714; 156/345.3

(58) Field of Classification Search .......... 438/706, 438/710, 712, 714, 720, 707; 118/723; 156/345.3, 156/3, 42

See application file for complete search history.

(56) References Cited

U.S. PATENT DOCUMENTS

| 4,358,686 A | 11/1982 | Kinoshita |
| 4,461,237 A * | 7/1984 | Hinkel et al. ............... 118/50.1 |
| 4,624,214 A | 11/1986 | Suzuki et al. |
| 4,740,268 A | 4/1988 | Bukhman |
| 4,769,101 A | 9/1988 | dos Santos Pereiro Ribeiro |
| 4,795,529 A | 1/1989 | Kawasaki et al. |
| 4,891,095 A | 1/1990 | Ishida et al. |
| 4,919,783 A | 4/1990 | Asamaki et al. |
| 4,943,345 A | 7/1990 | Asmussen et al. |
| 4,985,114 A | 1/1991 | Okudaira et al. |
| 5,038,013 A | 8/1991 | Akazawa et al. |
| 5,368,685 A * | 11/1994 | Kumihashi et al. ............ 216/70 |
| 5,417,798 A | 5/1995 | Nishibayashi et al. |
| 5,419,872 A * | 5/1995 | Montgomery et al. ....... 422/102 |
| 5,421,934 A * | 6/1995 | Misaka et al. ................. 216/59 |
| 5,501,893 A | 3/1996 | Laermer et al. |
| 5,518,572 A | 5/1996 | Kinoshita et al. |

(Continued)

FOREIGN PATENT DOCUMENTS

EP    0 363 982 A2    4/1990

(Continued)

*Primary Examiner*—Lan Vinh
(74) *Attorney, Agent, or Firm*—Volentine & Whitt, PLLC

(57) ABSTRACT

A plasma processing apparatus includes a chamber having a support for a substrate, and at least one gas inlet into the chamber. The apparatus is configured to alternately introduce an etch gas and a deposition gas into the chamber through the at least on gas inlet, and to strike a plasma into the etch gas and the deposition gas alternately introduced into the chamber. The apparatus is further equipped with an attenuation device for reducing and/or homogenizing the ion flux from the plasma substantially without affecting the neutral radical number density.

3 Claims, 12 Drawing Sheets

U.S. PATENT DOCUMENTS

| | | |
|---|---|---|
| 5,527,394 A | 6/1996 | Heinrich et al. |
| 5,556,501 A | 9/1996 | Collins et al. |
| 5,647,944 A | 7/1997 | Tsubaki et al. |
| 5,662,819 A | 9/1997 | Kadomura |
| 5,783,100 A | 7/1998 | Blalock et al. |
| 5,968,275 A | 10/1999 | Lee et al. |
| 6,060,836 A | 5/2000 | Maeno et al. |
| 6,076,483 A | 6/2000 | Shintani et al. |
| 6,093,332 A * | 7/2000 | Winniczek et al. ............. 216/2 |
| 6,403,490 B1 | 6/2002 | Lagarde et al. |
| 6,545,420 B1 * | 4/2003 | Collins et al. .......... 315/111.51 |
| 2002/0179015 A1 * | 12/2002 | Laermer et al. ....... 118/723 CB |

FOREIGN PATENT DOCUMENTS

| | | |
|---|---|---|
| EP | 0 451 943 A2 | 4/1990 |
| EP | 0 497 563 A2 | 8/1992 |
| EP | 0 522 296 A2 | 1/1993 |
| EP | 0522296 | 1/1993 |
| EP | 0 658 917 A2 | 6/1995 |
| EP | 0 200 951 A2 | 12/1996 |
| EP | 0 822 582 A2 | 2/1998 |
| EP | 0 822 584 A2 | 2/1998 |
| EP | 0 588 393 A2 | 6/1998 |
| EP | 0 831 416 A2 | 6/1998 |
| EP | 0 867 913 A1 | 9/1998 |
| GB | 2 105 729 A | 3/1983 |
| GB | 2 326 898 A | 2/1999 |
| JP | 61-39521 | 2/1986 |
| JP | 1-283020 | 9/1989 |
| JP | 2 118055 A | 5/1990 |
| JP | 05-062796 | 3/1993 |
| JP | 06-208971 | 7/1994 |
| JP | 07-221079 | 8/1995 |
| JP | 07-283206 | 10/1995 |
| JP | 08-279493 | 10/1996 |
| JP | 08-288259 | 11/1996 |
| JP | 10-135192 | 5/1998 |
| JP | 06-280027 | 10/2004 |
| WO | WO 94/24692 | 10/1994 |
| WO | WO 00/36631 | 6/2000 |
| WO | WO00/19501 | 4/2006 |

\* cited by examiner

PLASMA PROCESSING APPARATUS

CROSS-REFERENCE TO RELATED APPLICATION(S)

This is a Divisional of U.S. National Stage Application Ser. No. 09/601,958, filed Aug. 10, 2000 now abandoned, which is the U.S. counterpart of International Application No. PCT/GB99/04168, filed Dec. 10, 1999.

This invention relates to a plasma processing apparatus, in particular, although not exclusively, one for reducing and/or homogenizing the ion flux of a plasma without affecting the radical number density of the plasma. The invention also relates to means for reducing and/or homogenizing the ion flux and means for guiding neutral radicals.

When etching thin films or bulk material on a silicon wafer or work pieces of other material, it is important to be able to achieve simultaneously a high etch rate, an accurate trench profile, and good uniformity of the etch between different areas of the wafer.

A particular method to achieve highly anisotropic etches for high aspect ratio trenches is to use a switched process in which an etch step is alternated with a deposition step. Such a method is disclosed in WO-A-94/14187, EP-A-0822582 and EP-A-0822584.

In the case of deep trench silicon etching, a passivating layer may be deposited on all surfaces of the trench, during the deposition step. During the initial part of the etch step, the passivating layer will be removed preferentially from the bottom of the trench by ion bombardment. This then allows the silicon to be removed by an essentially chemical process, from the bottom of the trench, during the remainder of the etch step. Alternating deposition and etch steps, allows a high aspect ratio trench to be etched, contrasting with the use of the etch step alone which would result in a predominantly isotropic etch.

There are a number of factors which will influence each step of the deep etch process. In particular, during the etch step, the density of radicals will affect the rate of etch of exposed silicon, and the density, energy and direction of positive ions will affect where and how fast the passivating layer is removed.

For deep trench etching it is desirable to utilize a plasma processing apparatus which produces large numbers of radicals to achieve a high silicon etch rate. Indeed, conditions ideal for the etching step may not be ideal for the passivation step. At the same time, sufficient numbers of very directional, relatively low energy ions should be produced to remove the passivating layer from the bottom of the trench without at the same time removing a significant thickness of the photoresist mask. Clearly, once the mask has been etched away it is not possible to continue with the same degree of pattern transfer from the mask.

A plasma processing apparatus will produce both ions and radicals and the number of each will, in general, increase as the power input into the apparatus is increased. The relative numbers of radicals and ions may change with power input conditions, but will not necessarily be the ideal balance required for the deep trench etch.

The present invention, at least in some embodiments, discloses techniques and devices to adjust the balance of numbers, to modify spatial distributions and allow "discrete" optimization of both steps (etch and passivation), to ensure the etching of accurate trench profiles, with good uniformity of etch between different areas of the wafer. Methods of largely "decoupling" the generation of the etch species from that of the passivation species are presented. Indeed, the invention is applicable to all plasma processes where this may be beneficial.

According to a first aspect of the present invention, there is provided a plasma processing apparatus comprising means for striking a plasma in a chamber having a gas inlet and a support for a substrate, wherein the apparatus further comprises attenuation means for reducing and/or homogenizing the ion flux from the plasma substantially without affecting the radical number density.

The substrate support, and substrate may be electrically biased as appropriate to the process.

The attenuation means may extend partially or completely across the chamber.

A plasma processing apparatus may refer to an apparatus in which the process plasma is created and maintained by the inductive coupling of RF power into it, and bias is applied to the substrate (which may be a wafer/workpiece) by a second RF power source. However, this description is for the purpose of explaining the concepts involved, and is not intended to preclude apparatus in which plasma is generated by other means such as microwave, ECR, Helicon, Capacitive, DC, and pulsed power discharges etc, nor to preclude apparatus in which bias is applied to the substrate by DC or RF means whether pulsed or not.

The plasma processing apparatus may be used in a continuous or switched process with an attenuation means that may be changed in strength for each of the deposition and/or etch steps in a cyclic etch/deposition process.

The attenuation means may be any suitable attenuator or filter, and particular preferred examples are described below.

The plasma processing apparatus may further comprise means for providing alternating etch and deposition steps. The etch and deposition gases may be fed via the same or separate distribution systems.

Whilst $SF_6$ is used as an example of the etch gas, other etch gases may be used, and these are well known to those skilled in the art.

In a preferred embodiment, at least a portion of the chamber is formed of a dielectric material. Particularly, it is preferred that an upper part of the chamber is formed of a dielectric material, where the substrate support is in the lower part of the chamber. Preferably, an antenna is positioned externally adjacent the dielectric portion and this may serve to create a plasma production region in the chamber. The antenna may be used to inductively couple RF power into the plasma which is formed inside the apparatus. The frequency of the RF power is typically 13.56 MHz, but other frequencies may also be used.

The substrate support is preferably energized from a second RF supply. It is well known by those familiar with such systems, that the application of RF power to a substrate which is immersed in a plasma results in the formation of a quasi DC bias on the substrate, such as to accelerate positive ions towards the substrate.

The attenuation means may be positioned above the substrate on the support, and it is particularly preferred that it is positioned between the plasma production region and the substrate. The attenuation means has the purpose of attenuating the flux of ions which reach the substrate, while still allowing a dense plasma to exist in the production region.

The attenuation means has virtually no effect on the neutral radicals which are produced in the plasma production region, or in an upstream chamber, except for any small level of deposition or recombination on the attenuation means.

The attenuation means may comprise a magnetic portion. In particular, the attenuation means may comprise one or more permanent magnets. Alternatively, the attenuation means may comprise means for creating an electromagnetic field, for example in a variable manner. For example, the means may comprise a current carrying conductor. This has the advantage over using permanent magnets in that by adjusting the current passing through the conductor, the magnetic field strength may be adjusted as appropriate for any particular process. In a preferred structure the means for creating an electromagnetic field would comprise an array of electromagnetic coil groups separately orientated to create respective magnetic fields which are angularly offset with respect to one another. Advantageously three sets of coil groups are provided which are designed to create magnetic fields which are offset from one another by 60 degrees or 180 degrees. These can be energized in sequence to create a rotational field. Where the coils have the 60 degree offset, a full 360 degree rotational effect can be achieved by reversing the polarity of the power supply after an initial sequence of energizations of the three groups has taken place.

If desired the attenuation means may comprise both one or more permanent magnets and means for creating an electromagnetic field so that a chosen proportion of the field strength is constant from the permanent magnets, but may be increased or decreased by altering the current creating the electromagnetic field. As the electromagnetic field is only a proportion of the total field, the required current will be reduced when compared with that needed to create a total field, leading to a requirement for a smaller power supply and smaller cross-section conductors. This provides the possibility of, for example, making use of the attenuation during the etch step of a switched process, but reducing or switching off the field entirely during the deposition step. In fact the magnetic attenuation/filter strength can become a process variable, altered between steps of a switched process, or varied during the course of a non-switched process, or varied during the course of a switched process, or both altered between steps of a switched process with more gradual variation superimposed over the course of the process.

The attenuation means preferably produces a high field capable of significantly reducing the ion flux during the etch step. The magnetic field strength is preferably between 50 Gauss and 500 Gauss and is even more preferably between 150 Gauss and 300 Gauss.

In one embodiment, the attenuation means may comprise one or more tubular members carrying permanent magnets or conductors to form an electromagnet. These may be parallel to each other and, for example, may be parallel to the surface of the support, however, neither of these orientations is essential. They may extend over the full width of the chamber to provide a complete filter, or over part of the width to form a partial filter or may be spaced further apart, or utilising weaker magnets to form a partial filter. Additionally, or alternatively, the attenuation means may be substantially parallel to the side walls of the chamber, although this should not preclude the use of attenuation means for which the spacing from the wall of the chamber varies along their length. In one embodiment, the attenuation means extends from the lid of the chamber to a plate member extending from a wall of the chamber, preferably having an appropriately (for example centrally) located aperture therein. As an alternative, the upper end of the attenuation means may terminate on a plate member. Therefore, the attenuation means in such an embodiment may or may not extend all the way between the top and bottom of the dielectric window.

The attenuation means may be temperature controlled, for example cooled. Any suitable cooling medium may be used but specific examples are forced air and water. The cooling medium may be passed through the tubular members to ensure that the magnets are not subjected to high temperatures. A distribution member, for example in the form of a manifold, may be provided to distribute the cooling medium to the attenuation means.

The attenuation means and/or the distribution member may be electrically biased.

In one embodiment, the attenuation means may comprise one or more strong magnets and these are preferably positioned outside the plasma chamber, although alternatively they may be positioned just inside the chamber and are preferably cooled. Again, in such an embodiment, the strong magnets can be in the form of permanent magnets, electromagnets, or a combination of both.

The attenuation means may comprise a sheet member having a plurality of apertures therein, for example in the form of a "grid". The grid may have varying sizes of apertures at different positions and may have solid sections. In this embodiment, the sheet member is preferably metallic.

The purpose of the sheet member is to attenuate the ion flux reaching the substrate due to ion loss on the sheet member and also, if it is of metallic construction, to define an equi-potential plane for the plasma, so that ions which are accelerated towards the wafer pass through a well defined potential gradient between two parallel surfaces. The sheet member may be biased electrically with respect to the metallic components of the chamber—a negative bias on the sheet member will aid in the collection of ions.

If the overall "transparency" of the sheet member is low, there is the hazard that sufficient deposition may occur on it, thereby resulting in a reduction of deposition rate on the substrate during the deposition step. This factor may be reduced by heating the sheet member. In one embodiment, the sheet member may be positioned substantially parallel to the surface of the support, preferably at or near the bottom region of the dielectric window. Alternatively, the sheet member may be cylindrical. In such an embodiment, the apparatus may further comprise means for providing a gas (etch or deposition) to the chamber on either or both sides of the cylinder; this will depend on whether an etch step or a deposition step is in progress.

The sheet member may be located part way down the dielectric portion and may be supported in any suitable manner. For example, it may be supported from the lid of the chamber by means of a first supporting member and/or from below the dielectric portion by means of a second sheet supporting member. The sheet supporting members may be formed of any suitable material, but one example is a slotted conducting material. Alternatively, two dielectric portions of the chamber may be provided (a first and a second dielectric portion) having the attenuation means positioned therebetween. This allows a more practicable means of electrically biasing the sheet member and the general concept is also transferable to other geometries of the process apparatus.

Two or more antennae may be positioned externally adjacent the dielectric portion or portions and at least one antenna preferably lies above the level of the attenuation means, and at least one antenna lies below the level of the attenuation means. In such an embodiment, the chamber may be provided with an inlet to provide a gas or gases above the level of the attenuation means and a further inlet for providing a gas or gases below the level of the attenuation means. In particular the further antenna (or other means for striking a plasma) below the attenuation means may be provided for the deposition step of an etch/deposition process. Thus, where a further antenna is below the attenuation means, gas may be provided below the level of the attenuation means.

According to a further aspect of the present invention, there is provided an attenuation means for use in a plasma processing apparatus having means for striking a plasma in a chamber, wherein the attenuation means is capable of reducing and/or homogenizing the ion flux from the plasma substantially without affecting the radical number density.

The attenuation means may have the preferred or optional features mentioned above.

To etch a substrate with a switched process, as described previously, the attenuation means may be used to reduce the ion flux which reaches the substrate. In one embodiment, an additional means may be used to improve the uniformity of the etch across the substrate by modifying the flux of radicals reaching different areas of the substrate. Thus, the apparatus may further comprise means for guiding neutral radicals. This guiding means will normally act in conjunction with the ion attenuator, but may be used separately if appropriate.

When for example, fluorine radicals are used to etch silicon, the etch rate at a particular position is affected by the amount of surrounding silicon. This is because the silicon etch depletes the available fluorine radical flux. Therefore the etch rate is higher towards the edges of the exposed silicon, where there is less silicon on one or more sides, than at the centre of the substrate. By appropriate design, the guiding means can reduce the fluorine radical flux to the edge of the substrate while maintaining a high flow to the centre, thus reducing or eliminating the effect described above.

The guiding means may comprise a disc or other appropriate shape, which may have one or more apertures in it. In a preferred embodiment it is positioned above the substrate and below the attenuation means. The apertures are preferably shaped in relation to a pattern exposed on a substrate. A part of the guiding means is preferably positioned adjacent the substrate, preferably close thereto, for example at a distance less than 5 cm, typically less than 2 cm.

The guiding means is preferably formed of a conducting material and isolated from the ground, or of a dielectric material. The attenuation and guiding means may be discrete components separately mounted within the process chamber, or may be combined into a single module. The spacing between the attenuation and guiding components may be adjusted as appropriate, but at least part of the guiding means will usually be parallel to, and close to, the surface of the substrate, with the attenuation means nearer to the plasma production region. Furthermore, the precise shape of the guiding means may be adjusted to encourage a pressure or flow gradient across the substrate, in order to further optimise the process rate homogeneity across the substrate surface.

Any aperture(s) in the guiding means, and/or the external shape of the guiding means, may be appropriate to the shape of the substrate or to the shape of the pattern on the substrate. For example, a square aperture may be used in the guiding means if a square pattern is to be etched on a standard round wafer or for a square wafer.

Thus, according to a further aspect of the present invention, there is provided a guiding means for use in a plasma processing apparatus having means for striking a plasma in a chamber, wherein the guiding means is capable of guiding neutral radicals of an etch gas introduced into the chamber.

According to a further aspect of the present invention, there is provided a plasma processing apparatus comprising means for striking a plasma in a chamber having a gas inlet and a support for a substrate, wherein the apparatus further comprises a guiding means.

According to a further aspect of the present invention, there is provided a method of etching a feature in a substrate in a chamber, the method comprising striking a plasma in the chamber and reducing and/or homogenizing the ion flux from the plasma substantially without affecting the radical number density. The method may comprise the step of alternately etching the substrate and depositing a passivation layer on the substrate.

According to a further aspect of the present invention, there is provided a method of etching a feature in a substrate in a chamber, the method comprising alternately etching the substrate and depositing a passivation layer on the substrate, wherein neutral radicals during the etch step are guided by a guiding means to improve the uniformity of etching across the substrate.

For high etch rates, the number of radicals needs to be increased, and this may be achieved in a number of ways:

(a) By increasing the source power, the precursor gas dissociation fraction is increased. For example, $SF_6 \rightarrow SF_x + yF$. However, the efficiency is limited in terms of the number of fluorine radicals released from each $SF_6$ molecule, i.e. two fluorine radicals are readily liberated. However, the stability of the dissociates and recombination reactions limit release of more than two fluorine radicals from each $SF_6$ molecule. Even so, the etch rate can be significantly enhanced by the method of increasing the source power to effectively dissociate a greater number of $SF_6$ molecules. Once saturation occurs with respect to the fluorine radical yield, further rate enhancement can only be achieved by increasing the gas flow rate in proportion to the RF power;

(b) As pressure is increased, the radical number density increases as the number of collisions increases. But as the pressure is increased, the plasma density in low pressure high density systems can be reduced due to the "scattering" collisions which reduce the degree of confinement. Also pressure increase reduces etched profile anisotropy, as collisions impair the degree of directionality of ions. The result is profile deterioration through "bowing" etc, which becomes worse as the aspect ratio increases. Therefore, this method is also limited in application.

A means for overcoming the limitations and further enhancing the etch rate is by using a high power pulsed source. By using very high power pulses (ref. GB-A-2105729; G. Scarsbrook, I. P. Llewellyn and R. A. Heinecke. J. Vac Sci. Technol. A&(3), May/June 1989; and I. P. Llewellyn, G. Scarsbrook and R. A. Heinecke. SPIE Vol. 1148 Nonlinear Optical Properties of Materials (1989)) complete gas dissociation can occur, resulting in total fragmentation of the precursor.

Thus, according to a further aspect of the present invention, there is provided a method of etching a feature in a substrate, the method comprising applying pulsed high power to an etch source gas, and alternately etching the substrate and depositing a passivation layer on the substrate in a chamber.

The high power is preferably applied for between 100 microseconds and several milliseconds during each pulsed cycle. In a preferred embodiment, the power density of the pulsed high power is between 10 and 300 $W/cm^3$.

The method may further comprise the step of reducing and/or homogenizing the ion flux from the plasma substantially without affecting the radical number density and, for example, any of the above-mentioned methods can be used. The method may additionally, or alternatively, comprise the step of guiding neutral radicals.

According to a further aspect of the present invention, there is provided a plasma processing apparatus for performing the above method, the apparatus comprising a first chamber having an inlet for an etch source gas and a second chamber having a support for a substrate, wherein the first and second chambers are connected via an aperture, and wherein the apparatus further comprises a means for providing pulsed high power to the first chamber.

The pulsed high power discussed below is RF, but any power may be used, for example microwave or DC.

In one embodiment, the first chamber may comprise a dielectric window and the means for introducing the RF pulsed high power is an antenna which is preferably positioned externally adjacent the dielectric window.

The second chamber may be actually separated by a separating member from the first chamber and indeed more than one first chamber providing a pulsed source may be used.

The second chamber may have a separate gas inlet.

Preferably, the plasma processing apparatus further comprises attenuation means which may be in the region of the aperture. This attenuation means may be the same as the forms mentioned above, but is preferably in the form of magnets placed on either side of the aperture to form a magnetic filter. This improves the confinement of the pulsed plasma within the source. Alternatively, magnets may be located in tubes across the aperture in, for example, a similar configuration to that described above.

In one embodiment, a restricted conductance aperture connects the first and second chambers which allows a higher source pressure to be practically utilized.

According to a further aspect of the present invention, there is provided a method of etching a feature in a substrate, the method comprising applying a high density radical source to an etch source gas, and alternately etching the substrate and depositing a passivation layer on the substrate in a chamber.

The etch and/or deposition steps preferably take place by means of a plasma.

Although the invention has been defined above, it is to be understood that it includes any inventive combination of the features set out above or in the following description.

The invention may be performed in various ways and various specific embodiments thereof will now be described, by way of example, with reference to the accompanying drawings all of which illustrate embodiments of the invention, and in which.

Figure 16A:
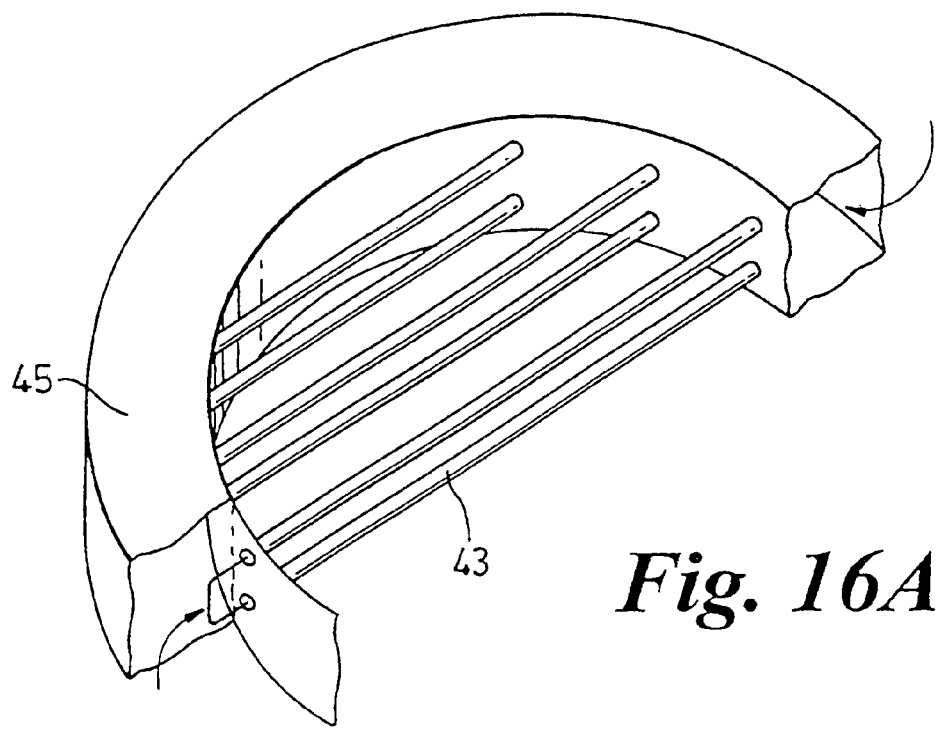

FIGS. 16A and B show an electromagnetic coil design; and

Figure 17A:
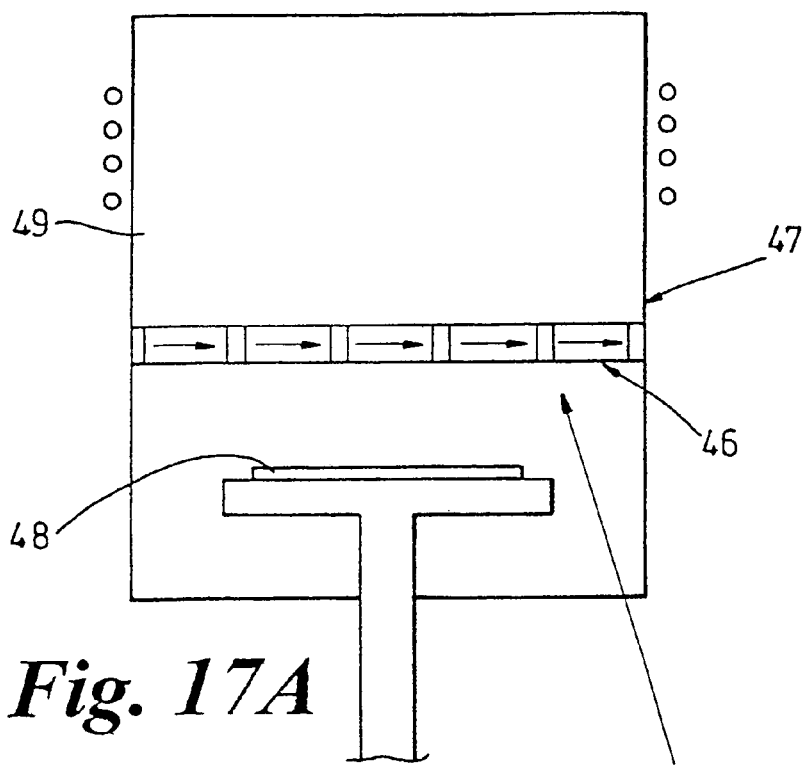
Figure 17B:
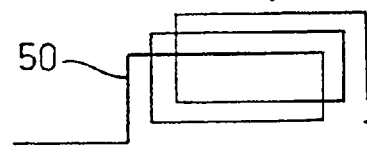
Figure 17C:
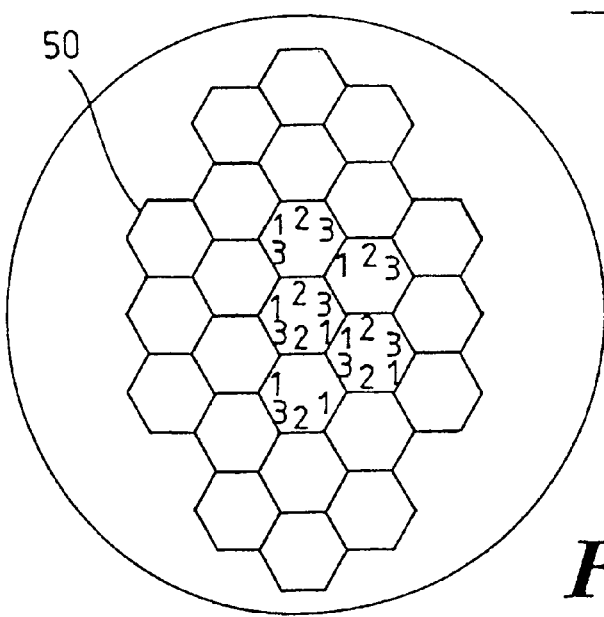

FIGS. 17A, 17B and 17C show particular features of a preferred electromagnetic coil attenuator structure.

Figure 1:
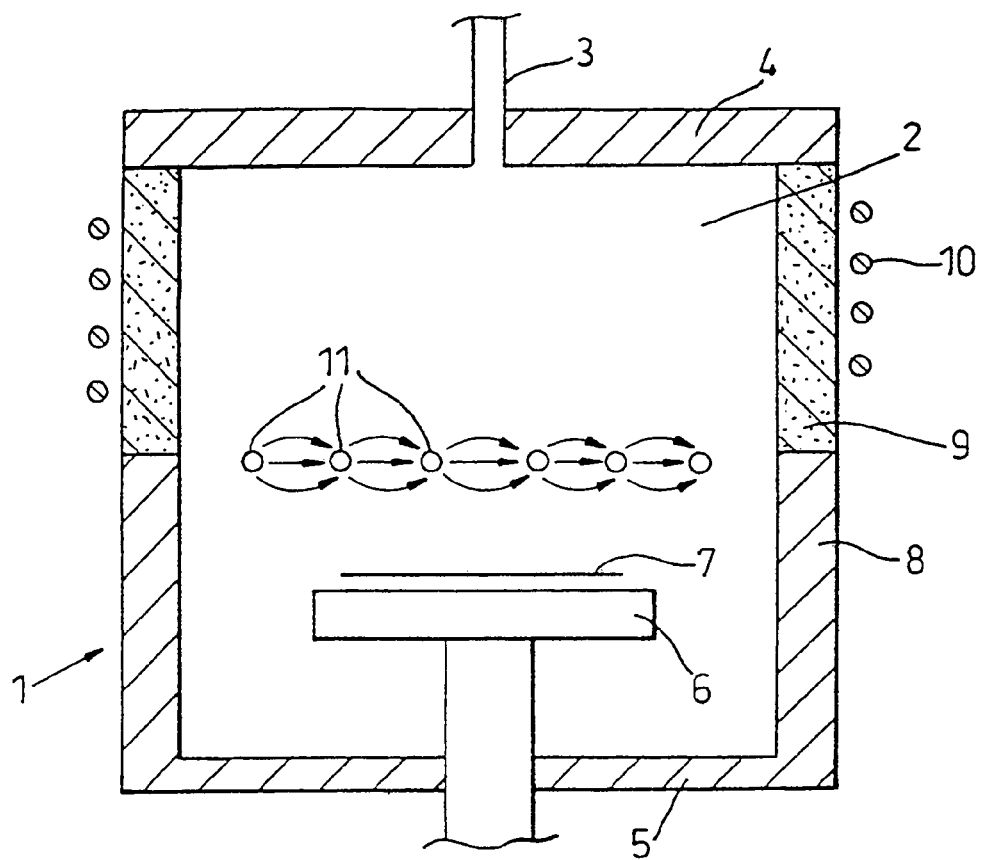
FIG. 1 is a cross-section of a plasma processing apparatus according to the present invention.

Referring to FIG. 1, there is shown a plasma processing apparatus generally at 1. The apparatus 1 comprises a chamber 2 into which an etch or deposition gas (or both) may be passed through inlet 3 in its lid 4. Extending through the base 5 of the chamber 2 is a platen 6 on which is mounted a wafer 7, for example a semiconductor wafer. The chamber 2 has a side wall 8, the upper region of which is formed as a dielectric window 9. An antenna 10 is located outside of the dielectric window 9 and is used to couple RF power inductively into the plasma which is formed inside the apparatus. The frequency of the RF power is 13.56 MHz, but other frequencies may also be used. In using the embodiment shown, in use etch and deposition gases are fed alternately through the inlet 3, depending on which of the etch or deposition steps is in progress. The platen 6 is energized from a second RF supply.

Figure 2:
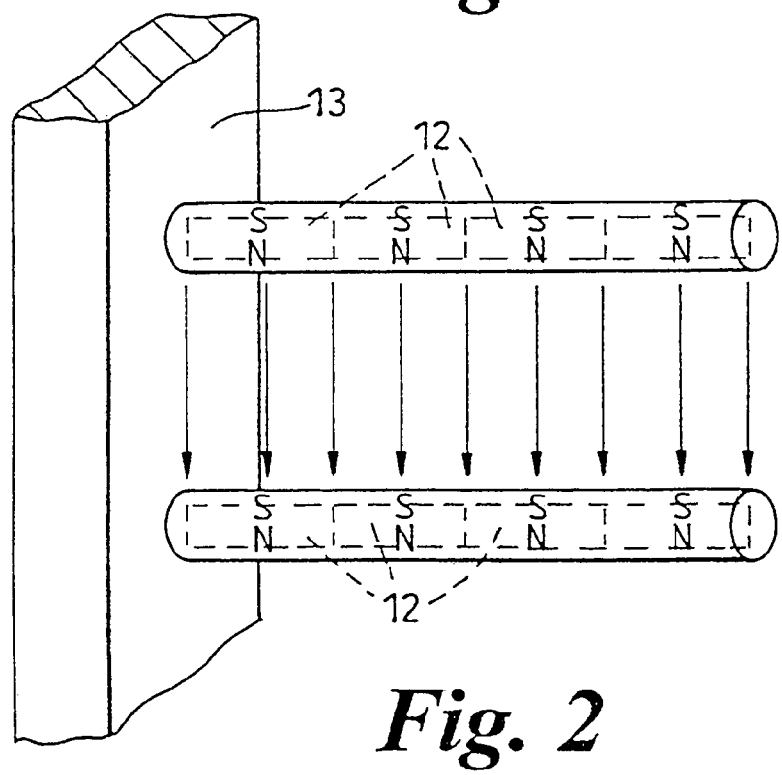
FIG. 2 is a cut-away plan view showing the magnet array of FIG. 1.

Within chamber 2, a series of parallel tubes 11 are mounted in a plane parallel to the surface of the platen 6. Each tube contains a small permanent magnet or series of magnets arranged as shown in FIG. 2. Forced air, water or other suitable cooling medium is passed through the tubes to ensure that the magnets are not subjected to high temperatures. The cooling medium is distributed by means of a manifold 13.

In an alternative form, the permanent magnets 12 may be replaced by current carrying conductors in tubes arranged, as mentioned above, in such a way as to create electromagnetic fields of similar strengths and orientations to those achieved by the permanent magnets. As a further variant, the use of a hybrid of permanent magnets and electromagnets is also envisaged. The principle of operation is that electrons from the plasma created near the antenna 10 move into the region of influence of the magnetic field, are guided by the magnetic field and lost to the wall 8 or manifold 13 due to an E x B drift. The electric field set up in the plasma by the loss of electrons ensures that ions are also attracted to the wall or manifold where they too are lost. The net result is a reduction in plasma density, on transmitting the magnetic field, from the region in which the plasma is produced to the region in which the wafer is placed. The magnetic field has no effect on the radicals, and the magnet carrying tubes have only marginal effect on the radical numbers due to a small degree of recombination on the surface. The magnet carrying tubes and/or manifold may be electrically biased if appropriate.

Use of this magnetic attenuator allows high RF powers to be applied to the plasma source, producing the high numbers of radicals needed for a high etch rate, but limits the number of ions which can reach the wafer so that the physical component is homogeneous and well controlled. Benefits include not only utilisation of high source power plasmas (allowing high etch rates), but also of enhancing the uniformity of the etch.

Figure 3:
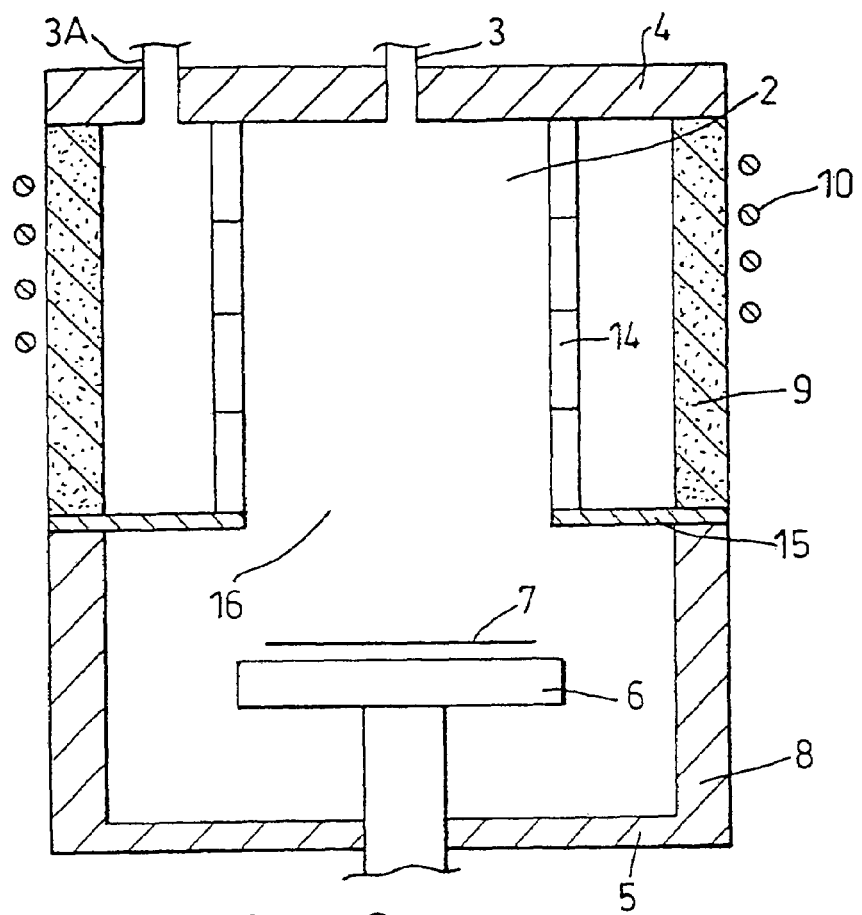
FIG. 3 shows an alternative apparatus of the present invention in cross-section.
Figure 4:
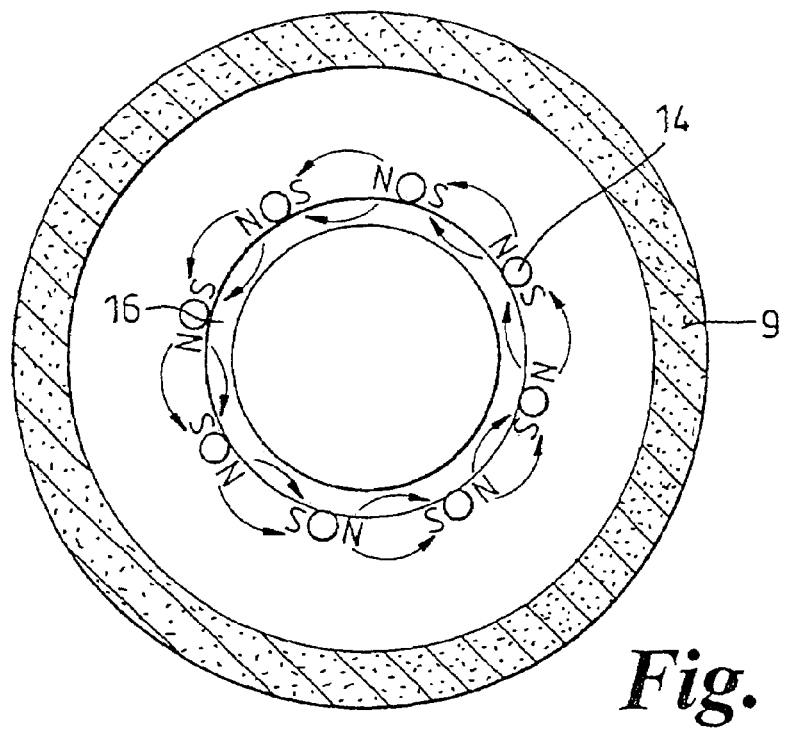
FIG. 4 shows a plan-section of the embodiment in FIG. 3.

FIGS. 3 and 4 show a variation in the apparatus in which identical reference numerals correspond to essentially identical parts. In the embodiment shown, permanent magnet carrying tubes 14 extend vertically and are placed in a "cage" arrangement to form an internal magnetic "bucket", with each tube substantially parallel to the dielectric window 9 and side wall 8. The principle of operation is the same as that described with reference to FIGS. 1 and 2 above. In FIG. 3, the tubes 14 are shown as terminating at their upper ends in the lid 4 of the chamber 2 and at their lower ends in a plate 15 having a central aperture 16. However, it should be noted that the upper ends of the tubes 14 need not necessarily terminate in the lid of the chamber, and may alternatively terminate in a similar plate to that used to locate the lower ends. The plate 15 or lid 4 allows the tubes 14 (which are normally conducting) to be electrically biased or grounded. The tubes 14 will provide a degree of electrostatic screening in addition to the magnetic filter structure and therefore will assist in decoupling the plasma generation local to the antenna from ion acceleration to the wafer which is brought about by the RF bias applied to the platen 6.

The magnet carrying tubes 14 may be air or fluid cooled, and if so will require suitable manifolds or interlinking at top and bottom ends.

Similarly to the planar magnetic filter, the permanent magnets may again be replaced by current carrying conductors in a suitable configuration of tubes to form an equivalent electromagnetic field. In addition, a hybrid of permanent and electromagnets may be used to form the required field pattern. Also shown in FIG. 3 is a second inlet 3A and this inlet 3A and inlet 3 may be attached to one or more distribution systems in order to feed the chamber with etch and/or deposition gases.

Figure 5:
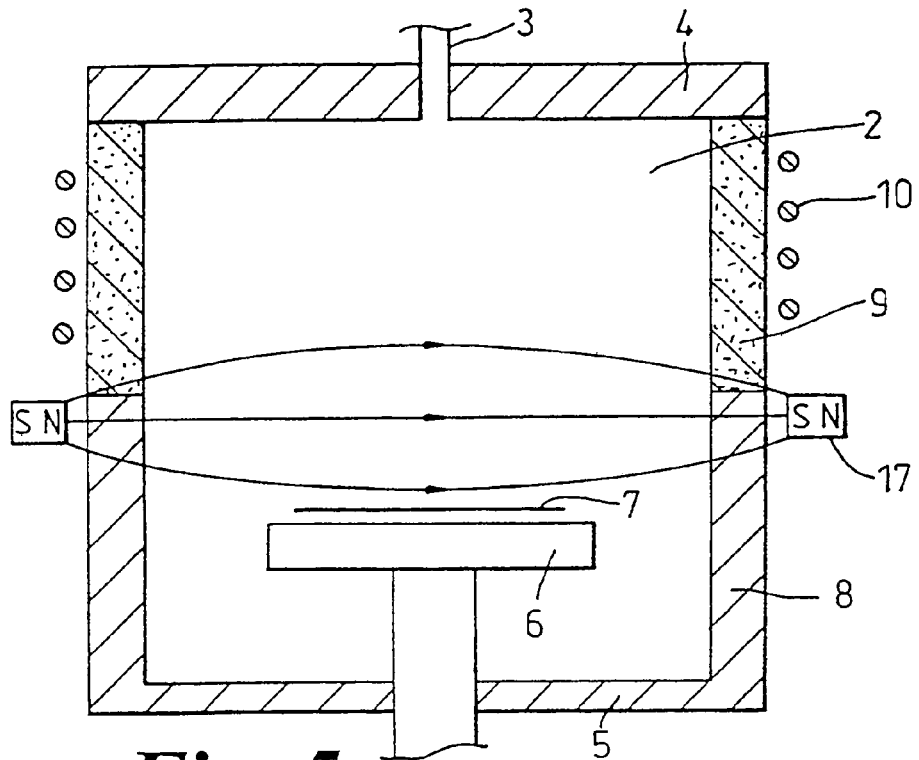
FIG. 5 shows a cross-section of an alternative apparatus.

FIG. 5 shows a further alternative arrangement. In the embodiment shown, outside chamber 2 are positioned strong magnets 17 adjacent to the sidewall 8, just below the level of the dielectric window 9. The strong magnets 17 create a long range magnetic field. This arrangement is simpler and cheaper to construct, but suffers from the disadvantage that the magnetic field will have a significant magnitude throughout a sizable part of the apparatus. This may affect the plasma production region and perhaps more seriously, may result in a significant magnetic field strength at the wafer surface. The magnetic field may be created by permanent magnets or electromagnets, or a combination of both.

Figure 6:
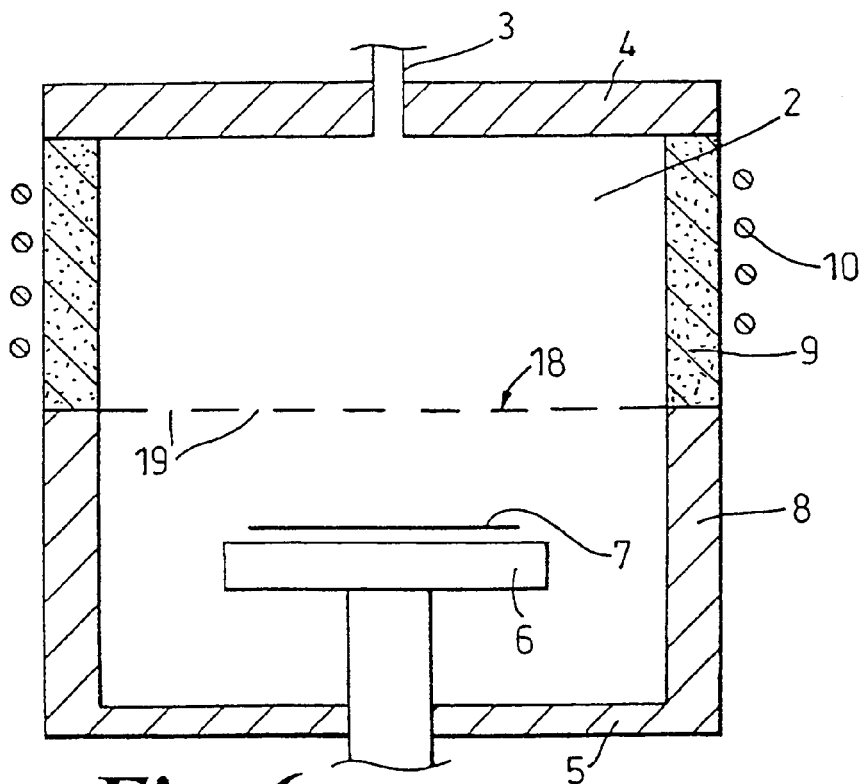
FIG. 6 shows a cross-section of a further alternative apparatus.

FIG. 6 shows an alternative arrangement in which a horizontally disposed grid 18 is located across the chamber 2, separating the plasma production region, adjacent to the dielectric window 9, from the wafer 7. The grid 18 has apertures 19 of varying sizes at different positions and may have solid sections with no apertures. The effect of the grid 18 is to attenuate the ion flux reaching the wafer due to ion loss on the grid 18, as described above.

Figure 7:
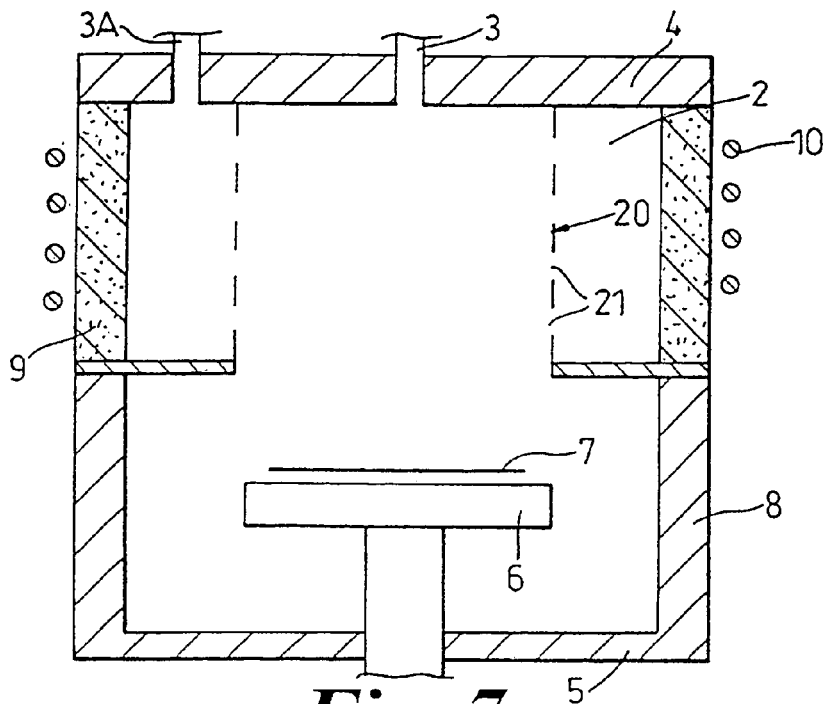
FIG. 7 shows a cross-section of a further embodiment of the apparatus.

FIG. 7 shows a variation of the design described with reference to FIG. 6. In this embodiment, a grid 20 having apertures 21 is of cylindrical form (for a cylindrical process chamber). Gas may be fed in at either or both of inlet 3 or the second inlet 3A depending on whether a deposition step or an etch step is in progress. Similarly to the system as described with reference to FIG. 3, the grid 20 may or may not extend all the way from the lid 4 to the bottom of the dielectric window 9.

Figure 8:
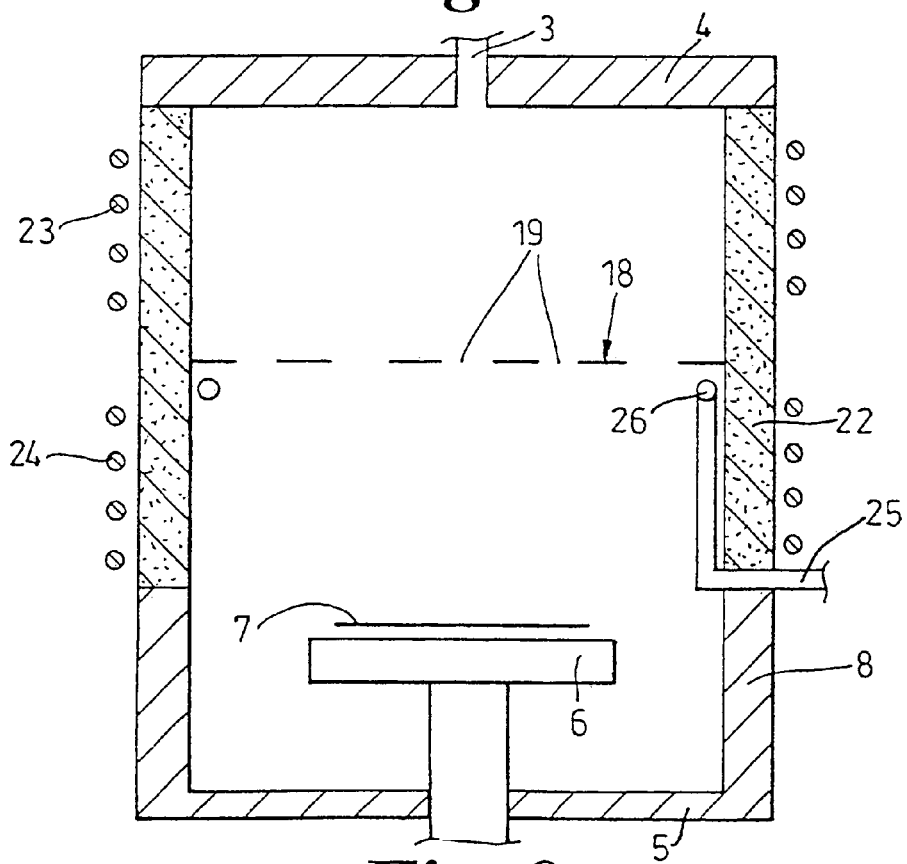
FIG. 8 shows a cross-section of a further alternative embodiment.

A more complex form of the plasma processing apparatus is shown in FIG. 8. A grid 18 is located part way down a dielectric window 22. The grid 18 may be supported from the lid 4 or from below the dielectric window 22. As proposed above, the grid 18 may have a number of identical apertures in it or may have sections additionally having larger apertures or sections which are blanked off with the aim of producing spatial improvements in the uniformity of the overall etch at various positions on the wafer 7. Two antennae 23, 24 are wound around dielectric window 22, antenna 23 being positioned above the level of grid 18 and an antenna 24 being positioned below it. Gas is fed through inlet 3 to the chamber and a further gas inlet 25 feeds a gas ring 26 or similar gas distribution device located below grid structure 18. As before, the wafer 7 is supported on a platen 6 near the bottom of the chamber.

With the similar plasma processing chambers shown in FIGS. 6 and 7, passivating material may be deposited on the grid structure during the deposition step. This effect may be reduced by ensuring that the grid structure is heated, but there may still be a need for enhanced passivation when the grid structure is present.

For the apparatus shown in FIG. 8, the preferred method of operation is as follows. For the etch step, gas is fed into inlet 3 and antenna 23 is energized. Radicals pass through the grid structure 18 down to the surface of the wafer 7, while the positive ions are attenuated and their spatial distribution modified by the grid structure. If found to be of benefit, antenna 24 may also be energized at a low power level, and some gas used in the etch step may be introduced through gas inlet 25. For the deposition step, the appropriate gas is fed to gas inlet 25, and antenna 24 is energized. It would not normally be necessary to energise antenna 23 or feed gas into inlet 3 during the deposition step of the process.

For the apparatus shown in FIG. 8, the grid structure 18 may be replaced by a magnetic attenuator of any of the forms previously described, with the operating scenario essentially unchanged.

As discussed above, a means for further enhancing the etch rate is to use a high power pulsed source. By using very high power pulses, complete gas dissociation can occur, resulting in total fragmentation of the etch gas precursor. Thus, for example, where $SF_6$ is the etch gas, complete gas dissociation occurs as follows:

$$SF_6 \rightarrow S+6F$$

Typical pulsed RF power levels and pulse duration are of the order of 50 kW and 200 µS respectively, but the pulsed power required is a function of the source size, and requirements may be as high as 200-300 W/cm$^3$ to achieve high dissociation of the gas. The range of conditions that are relevant here include 100 µS to several mS pulse duration and 10 to 300 W/cm$^3$ power density, depending on the degree of dissociation enhancement required. The source may comprise cooled members to enhance sulphur condensation on to the surface.

Figure 9:
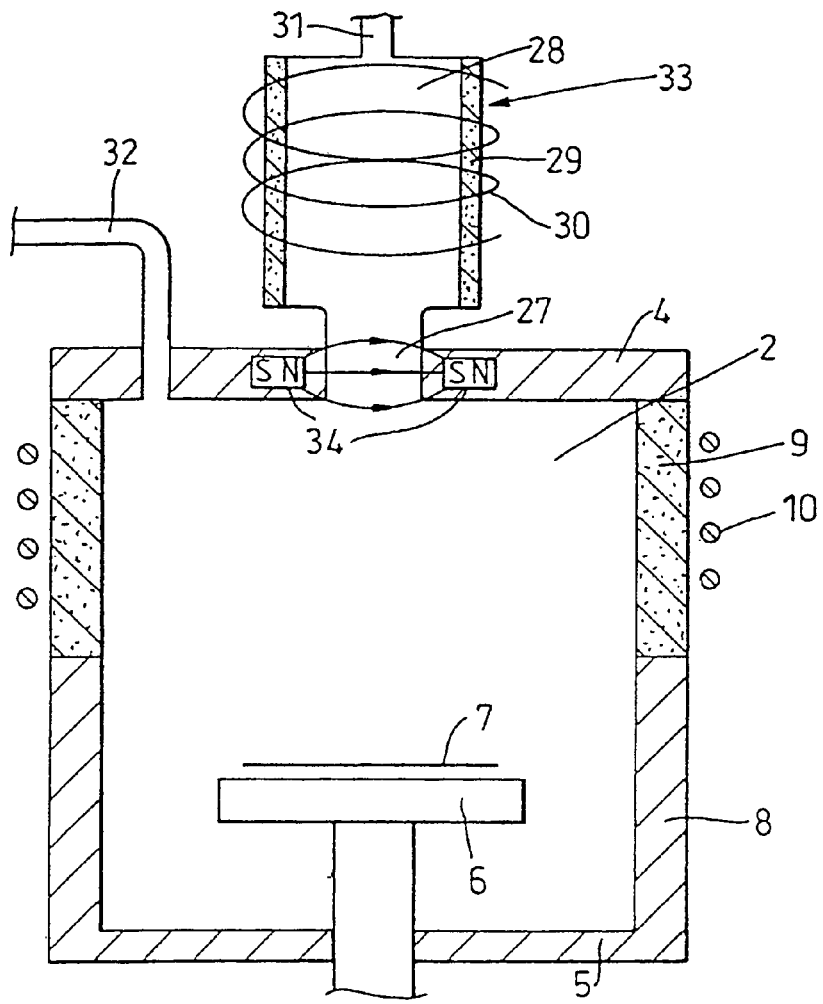
FIG. 9 shows a cross-section of a further alternative embodiment illustrating the design of an aperture into a plasma chamber.

FIG. 9 shows an apparatus for achieving these requirements. In the embodiment shown, an aperture 27 is present in the lid 4 of chamber 2. Extending from the aperture 27 is a subsidiary chamber 28 having dielectric window sidewalls 29 around which is wound antenna 30. The subsidiary chamber 28 has an inlet 31 in its upper surface for providing the etch gas. Also positioned in the lid 4 of chamber 2 is inlet 32 through which is provided the passivation gas or an etch related gas. Antenna 10 around dielectric window 9 forms the passivation or etch plasma as above. The subsidiary chamber 28, dielectric side walls 29, antenna 30 and inlet 31 together form a high power pulsed source generally shown at 33. The aim is to produce copious numbers of radicals within the pulsed source 33 which then diffuse into the main process chamber. In order to improve the confinement of the pulsed plasma within the source, magnets 34 are positioned either side of the aperture 27 to form a magnetic filter. Alternatively, magnets may be located in tubes across the aperture in a similar configuration to that shown in FIGS. 1 and 2, for example, for dividing the main process chamber 2.

Figure 10:
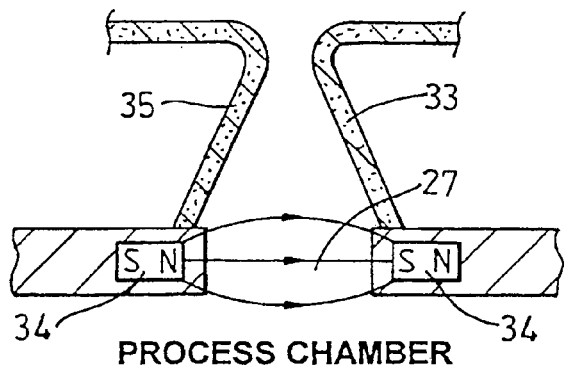
FIG. 10 shows an enlarged cross-section of another embodiment of an aperture into a plasma chamber.

FIG. 10 shows an alternative embodiment in the region of the aperture 27. In this embodiment, the lower portion of the subsidiary chamber comprises walls 35 which converge at their upper end opposite the end at aperture 27. Although the Figure shows tapering of the dielectric section, this section may alternatively be of metallic construction, possibly as an extension of the separating member structure. This provides a low pumping conductance aperture and, in such an embodiment, the pressure in the pulsed high power plasma source may be increased without having a detrimental effect on the pressure in the main process chamber 2.

The aim of the embodiments presented in FIGS. 9 and 10 is to create a high radical density source which can provide a means for carrying out the etching step while the deposition plasma source is separated. The high pulsed power source presented above can be replaced by any high density radical source (whether plasma or non plasma). When this source produces undesirable electrically charged components, the attenuation means described above can effectively be used to restrict their transmission to the wafer. But where the source predominantly generates radicals only, such attenuation means would not be necessary. Here, the scope of the invention reverts to the use of a high radical source comprising the etch step species generation within the etch/deposition cyclic processing regime.

Figure 11:
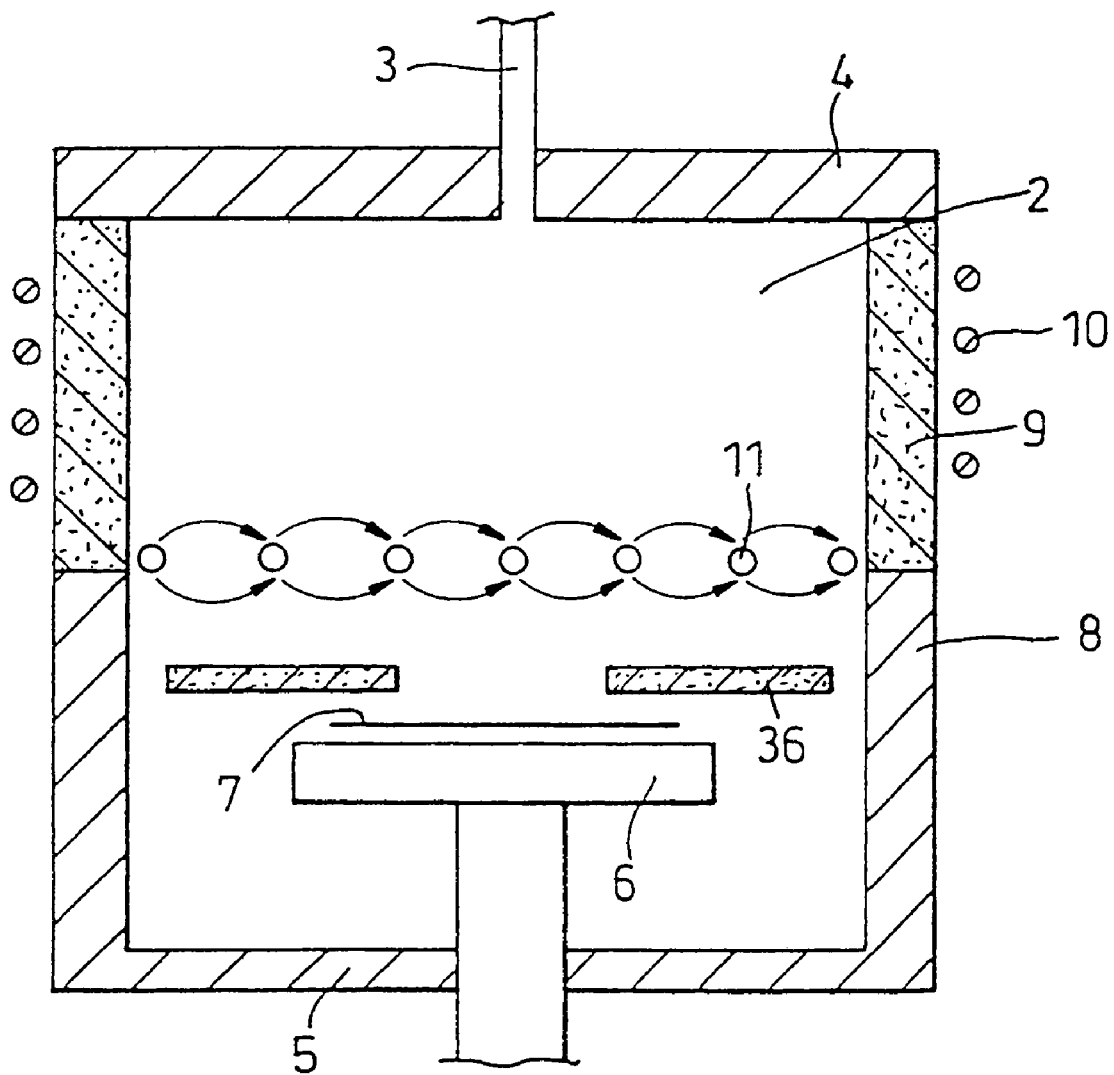
FIG. 11 is a cross-section of a plasma processing apparatus incorporating a guiding means.

FIG. 11 shows an apparatus similar to that in FIG. 1, except that it incorporates a guiding means in the form of a disc 36. The disc 36 is positioned above wafer 7 and below tubes 11 and may have one or more apertures therein. Radicals may reach the wafer 7, where chemical reactions will take place, by passing through the aperture(s), or around the disc 36, and diffusing over the surface of the wafer 7. Thereby, the function of the disc 36 is to reduce the processing rate (by limiting the flux density) at areas located beneath it. The closer the disc 36 is to the wafer 7, the greater the attenuation of the processing rate. When the disc 36 is very close to the wafer 7 (spaced less than 10 mm), there is a possibility of local electromagnetic field perturbation, particularly if the disc 36 is made of conducting material and grounded. In some applications this may become detrimental. In the preferred embodiment, the disc 36 is either made from a conducting material and isolated from ground, or made from a dielectric material. The isolated conducting material or the dielectric material will attain the floating potential of the local plasma as a balance occurs between the fluxes of ions and electrons reaching it. Other ions will pass through the aperture(s) in the disc 36, or around it, to reach the substrate.

Figure 12A:
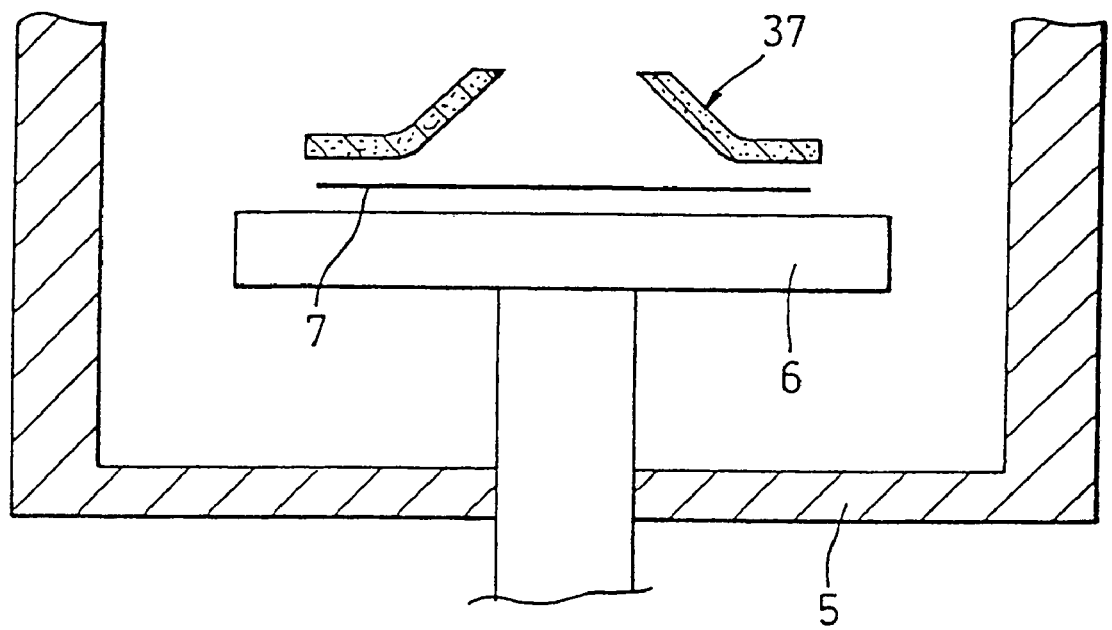
FIG. 12A is a cut-away view of a lower part of a chamber showing a guiding means.
Figure 12B:
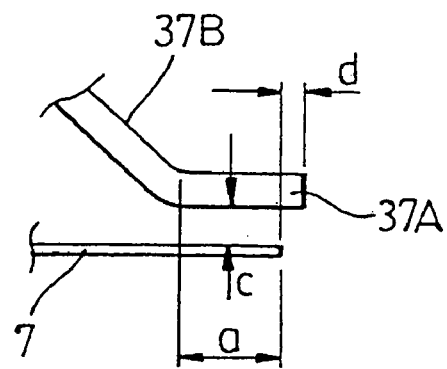
FIG. 12B is an enlarged view of part of FIG. 12A.

FIG. 12A shows an alternatively shaped guiding means 37, which encourages a pressure or flow gradient across the wafer 7. However, an even more complex geometry (with apertures if necessary) may be used, depending on the substrate and etch pattern shape, reactor design and local pressure and gas flow behaviour. FIG. 12B shows an enlarged view of part of FIG. 12A intended to overcome the excess radical flux to the edge of wafer 7, as described above. The shaped guiding means 37 has a portion 37A parallel to the wafer 7 and an inclined portion 37B. The inclined portion 37B provides increasing flux to the surface of wafer 7—without this, the "edge effect" may occur with respect to the inside edge of the guiding means. In the embodiment shown, dimension d is small, so that the edge of portion 37A is close to the edge of wafer 7. Dimensions a, c and d can be adjusted as necessary to compensate for edge effects.

Figure 13:
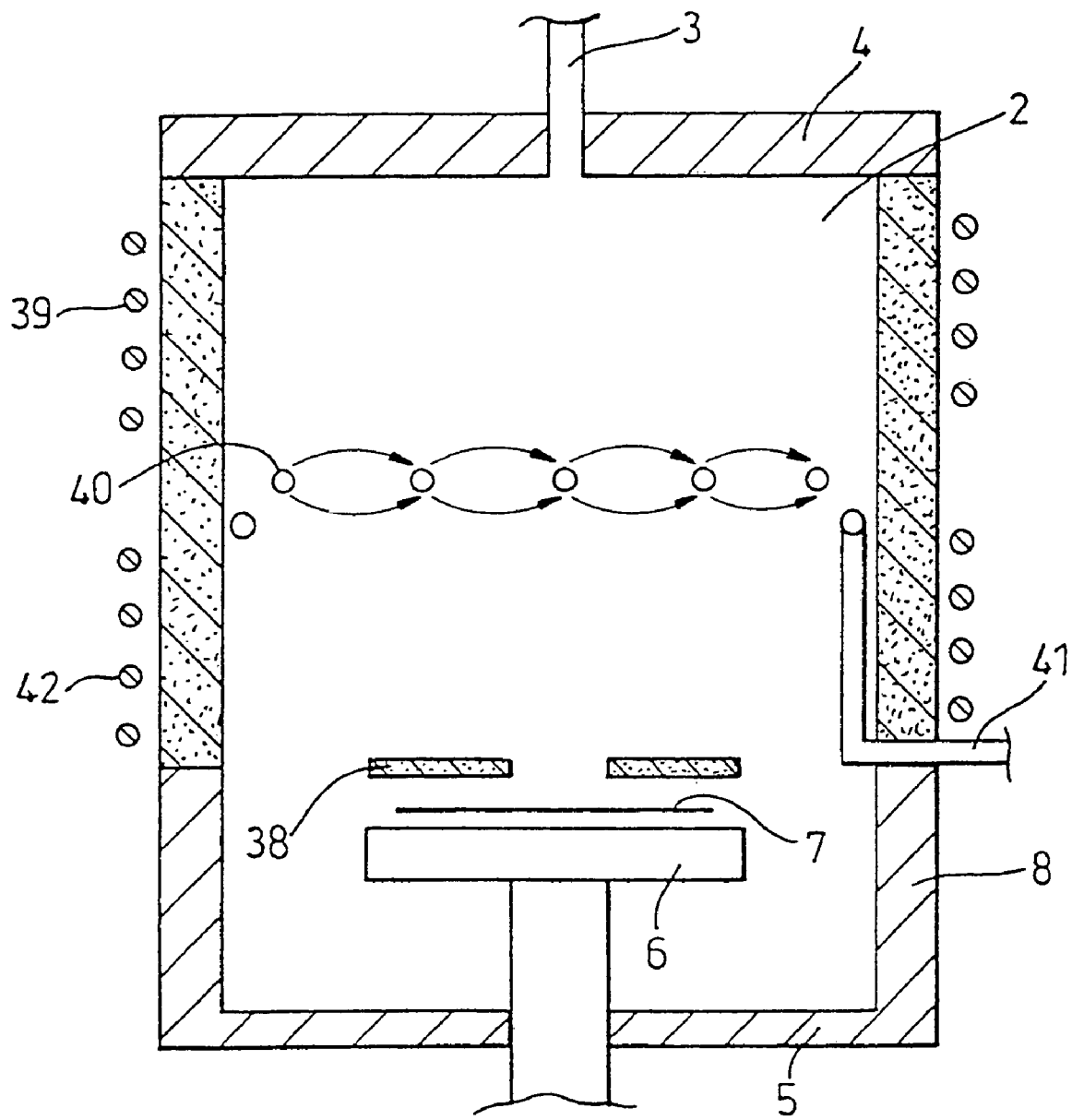
FIG. 13 is an alternative apparatus incorporating a guiding means.

The guiding means may be installed in a process chamber which utilizes a de-coupled plasma source, for example as shown in FIG. 13. The guiding structure is shown at 38. Antenna 39 is used to strike and maintain the relatively high power plasma for the etch step, utilising gas from a first gas distribution system through inlet 3. This intense discharge leads to the creation of large numbers of radicals, which diffuse towards the wafer 7 and are guided to the wafer surface by the guide structure 38. The high ion flux from the discharge is reduced by the attenuation structure 40 to an appropriate level for the process.

For the deposition step, gas may be introduced either above or below the attenuation structure 40, through inlet 3, or through inlet 41 linked to a second gas distribution system. Antenna 42 may be used to produce a plasma of suitable density for the deposition process. With this scenario, for the deposition step, antenna 39 would not normally be energized. An alternative arrangement in which antenna 42 is not fitted on the apparatus, would utilize a plasma struck and maintained by antenna 39 utilising the appropriate deposition gas, or alternative gas, fed via gas distribution systems. Deposition gas would be introduced through inlet 41. In either case the deposition material diffuses down to the guide structure 38, where it is guided to the surface of the wafer 7.

The guiding structure may also be used in the apparatus shown in FIG. 9 in which large numbers of radicals are produced in a separate chamber. The purpose of the guiding structure, however, remains the same as described above.

The guiding structure may be heated to reduce the deposition on it.

Figure 14:
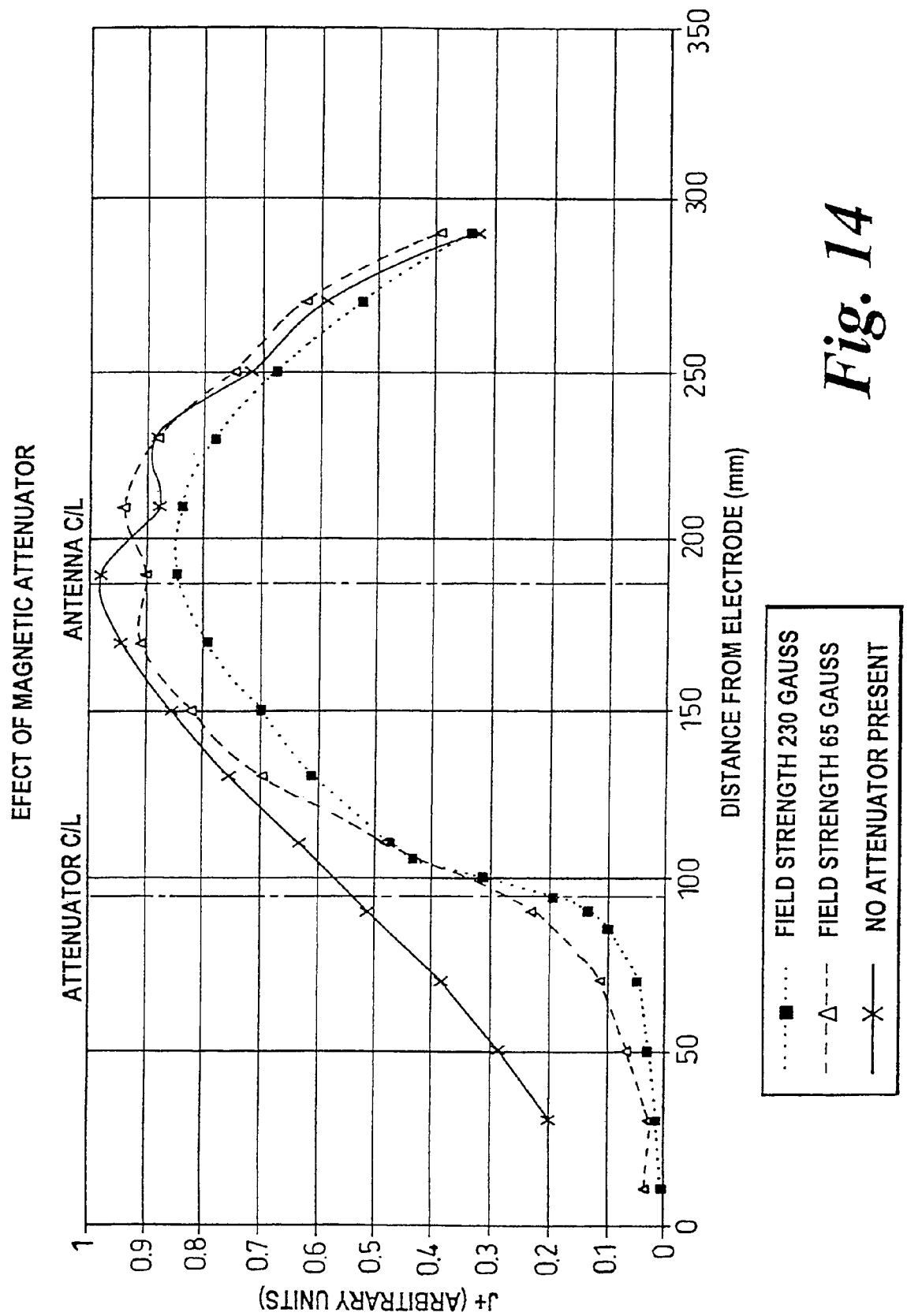
FIG. 14 shows experimental measurements of positive ion current density, obtained using attenuation means of the form shown in FIGS. 1 and 2.

FIG. 14 shows the results from three sets of experimental measurements of positive ion current density plotted against distance above the substrate surface. When two of the sets of measurements were taken, a magnetic attenuator of the form shown in FIGS. 1 and 2 was present.

The conditions were:
(a) No magnetic attenuator in the process chamber.
(b) Magnetic attenuator present, at position shown, with peak field strength of 65 gauss mid-way between the magnet carrying tubes.
(c) Magnetic attenuator present, with peak field strength of 230 gauss mid-way between the magnet carrying tubes.

RF power was applied to an antenna positioned around a dielectric section of the process chamber at the position shown in FIGS. 1 and 2.

The measurements show that the plasma has the greatest density at or near the antenna position, and diffuses both towards the lid of the process chamber and towards the substrate.

The effect of the magnetic attenuator is clearly visible, with the ion density below it, and towards the substrate, significantly reduced.

For the three conditions, simple etch and deposition processes were carried out. The results from these are shown below in table 1.

TABLE 1

| Geometry | Field strength (gauss) | Deposition rate (A/min) | Etch rate (µm/min) |
|---|---|---|---|
| No attenuator | 0 | 428 | 1.34 |
| Low field attenuator | 65 | 110 | 1.03 |
| High field attenuator | 230 | approx. 0 | 0.96 |

The table shows that the magnetic attenuator causes a relatively small reduction in etch rate, as the field strength is increased, but a much greater reduction in the deposition rate.

The etch rate is expected to be primarily determined by relatively long lived neutral radicals formed in the vicinity of the antenna, with a lesser effect due to ions transported to the surface of the substrate. This is consistent with the observed results which show a 30% reduction in the etch rate as the field is increased.

The deposition rate is strongly affected by the presence of the magnetic field, indicating that the charged particle density local to the substrate, is important to the deposition process.

For a switched etch/deposition process, this result indicates the potential advantage of using an electromagnetic attenuator, which could be controlled to provide a strong magnetic field during the etch step and a weak field during the deposition step. Note that the purpose of the strong field during the etch step is to attenuate the ion flux reaching the substrate, which removes the passivating layer, while allowing the plasma density to remain high in the vicinity of the antenna, thus providing a high density of radicals to etch the underlying material. The RF power supplied to the plasma formed in the vicinity of the antenna, may be set to different levels during each of the two steps, creating plasmas of differing densities. In particular, the power supplied during the etch step is likely to be much greater than during the deposition step.

Figure 15:
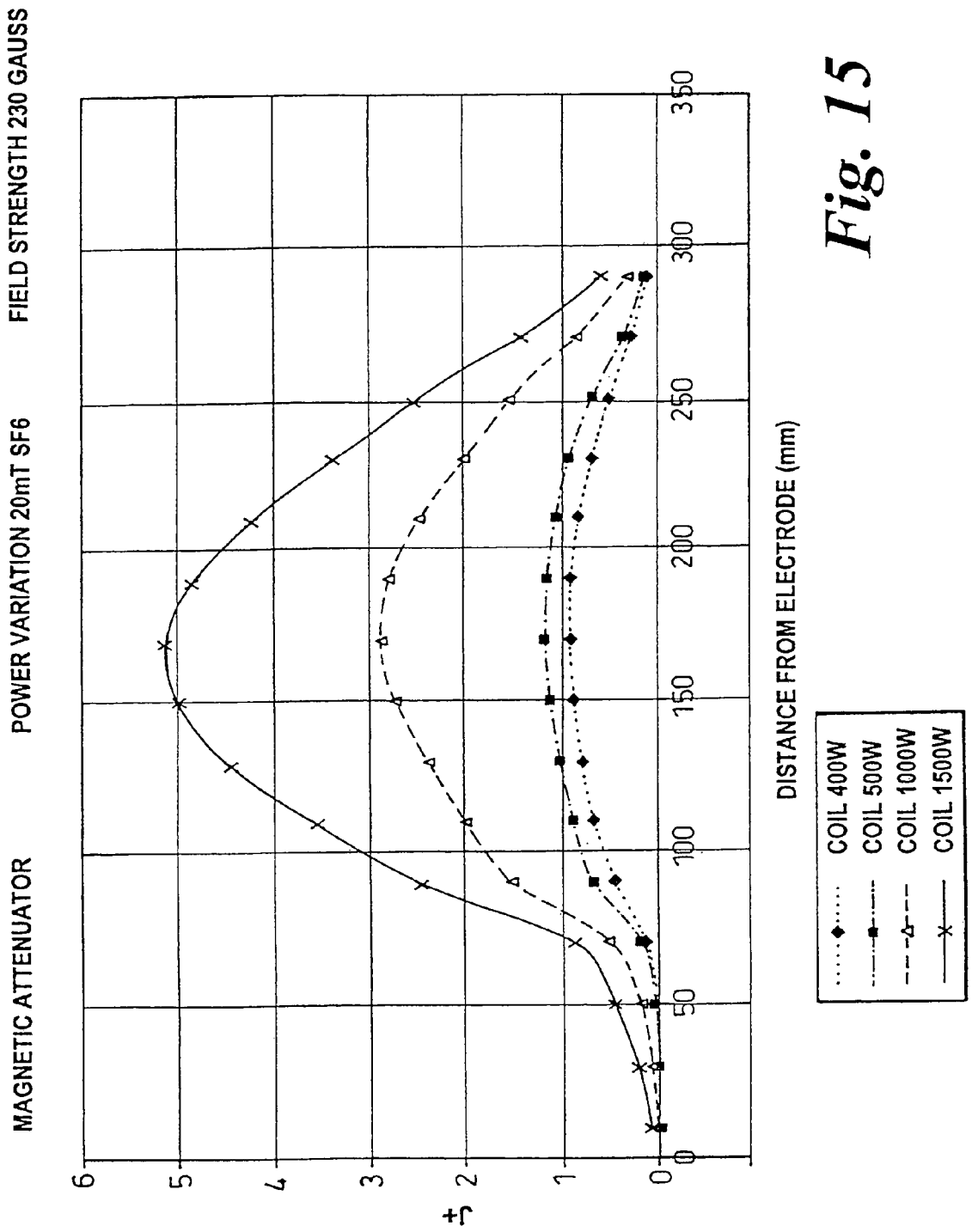
FIG. 15 shows experimental measurements at various powers.

FIG. 15 shows the results of experimental measurements of positive ion current density plotted against distance above the substrate surface at various antenna powers.

Figure 16B:
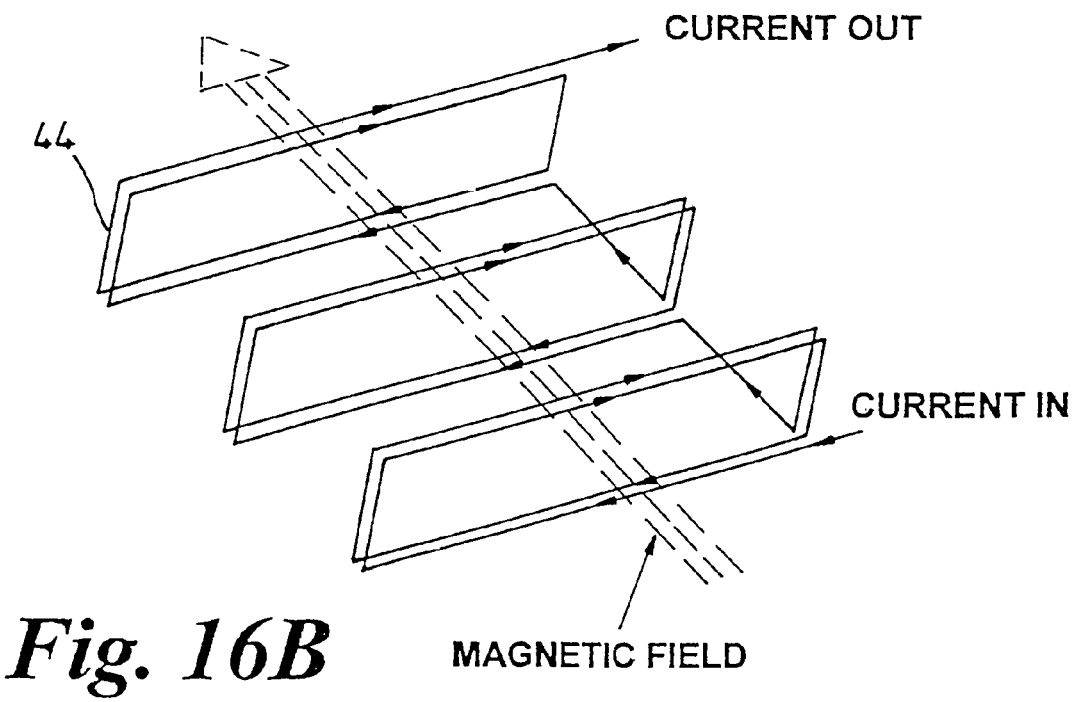

FIGS. 16A and 16B show a cut-away view of a possible arrangement of an electromagnetic attenuator and a possible arrangement of part of a coil winding for the attenuator. The manifold tubes 43 of FIG. 16A carry the windings 44 in the arrangement shown in FIG. 16B. The tubes 43 are linked to a manifold 45 allowing for air or fluid cooling of the windings 44 in the tubes 43.

The device shown in FIG. 17A consists of an electromagnetic ion attenuator 46, installed in a plasma-processing chamber 47, with the purpose being to allow neutral radicals to reach the substrate 48 from the high-density plasma region 49, while attenuating the flux of ions that reach the substrate 48.

The device consists of a number of current carrying coils of wire 50 (see FIG. 17B), which each produce a local magnetic field. The coils are located within the plasma processing chamber but are protected from direct contact with the plasma by a structure which has high transparency to the passage of neutrals. The arrangement of the number of coils is such that groups of them are connected together. At a given time one or more groups may be energized, providing a magnetic field across the processing chamber 47, which attenuates the flux of ions reaching the substrate 48, while offering minimal obstruction to the passage of neutrals.

The location of the coils that produce the magnetic field, within the processing chamber, allows a field to be produced that is localized in the vertical direction i.e. does not extend greatly into the high-density plasma region 49, or down towards the substrate 48. This is achieved because the coils can be spaced a few tens of mm apart so that the field is localized to a distance of this order in the vertical direction. This is in contrast to placing coils or permanent magnets outside of the processing chamber, when the magnetic field will extend of the order of hundreds of mm in the vertical direction, because the coils or permanent magnets are spaced hundreds of mm apart. A long range field extending into the high density plasma region may reduce the effectiveness with which power is coupled into the plasma, while a significant field strength at the substrate surface may affect the directionality of ions which reach the substrate.

The groups of coils have their terminations brought out of the processing chamber via suitable feedthroughs that are compatible with the vacuum properties required in the chamber. Fluid or gas may be circulated around the coils to remove the heat produced by ohmic heating of the wire and the heat transferred to the structure surrounding the coils, by the plasma. The structure surrounding the coils must be constructed such as to prevent the fluid or gas from escaping into the processing chamber and further feedthroughs may need to be installed for introducing the fluid or gas. A group of coils is energized by the connection of a power supply through wires to the appropriate feedthrough connections.

A particular arrangement of coils may be such that they are arranged in three groups, with the terminations of the coils such that one wire provides the current feed and a second wire provides the current return for each group. That gives six wires in total for the three groups. A possible array is illustrated in FIG. 17C, which shows a plan view of the coil structure and the location of each of the coil groups, numbered 1, 2, 3 respectively. When a power supply is connected to the pair of wires for the first group of coils, a uniform magnetic field is created across the processing chamber. Connection of the power supply to the second group of coils with the first disconnected, produces a similar magnetic field but now at a 60 degree angle to that produced by the first group of coils, when viewed along the axis of the process chamber. Connection of the power supply to the third group of coils, with the other two groups not energized, leads to a magnetic field that is rotated by a further 60 degrees with respect to the first group of coils. Therefore, if each group of coils is energized in turn, the magnetic field across the processing chamber will rotate in steps of 60 degrees. A reversal of the polarity of the power supply then allows the field direction to rotate in further steps of 60 degrees as each group of coils in turn is energized. The net effect is a full 360-degree rotation of the field direction as the different coil groups are energized, with the power supply polarity reversed at the appropriate stage. The application of a 3 phase AC power supply to the groups of coils, such that each group is connected across one phase, results in the formation of a magnetic field which rotates at the frequency of the supply.

Although in the above description, the coils are orientated to produce a 60 degree rotation of the field direction when each group in turn is energized, this does not preclude the use of coils orientated to produce larger or smaller angular changes to the direction of the magnetic field. It is not essential that coil groups are energized in a particular order. Therefore the net effect may be a clockwise or anticlockwise rotation of the field or any other sequential or random orientation.

It is desirable to rotate or otherwise alter the magnetic field direction during processing to reduce any non-uniformities in the processing of the substrate due to the influence of the magnetic field on the trajectories of those ions which reach the substrate.

In conclusion, the construction and operation of an ion attenuator using a number of groups of coils located inside the processing chamber has three potential benefits.
1. The magnetic field across the chamber is more localized in the vertical direction than if coils or permanent magnets were located outside the chamber.
2. The use of coils rather than permanent magnets allows the field strength to be varied during a process; in particular it allows the field strength to be switched between different levels during different steps of a process.
3. The magnetic field across the chamber can be rotated to improve the uniformity of the process, when the magnetic field may influence the directionality of those ions that reach the substrate.

The invention claimed is:
1. A method of etching a feature in a substrate in a chamber, the method comprising:
   striking a plasma in the chamber, the plasma having an ion flux therefrom with a radical number density;

alternately etching the substrate and depositing a passivation layer on the substrate; and reducing the ion flux from the plasma using an attenuation means substantially without affecting the radical number density, wherein a strength of the attenuation means is varied for each of the deposition and/or etching steps, and in which the attenuation means comprises means for creating an electromagnetic field which is reduced or switched off during the deposition.

2. A method of etching a feature in a substrate in a chamber, the method comprising:

striking a plasma in the chamber, the plasma having an ion flux therefrom with a radical number density;

alternately etching the substrate and depositing a passivation layer on the substrate; and reducing the ion flux from the plasma substantially without affecting the radical number density, wherein power is supplied to the plasma during the etching and deposition, and wherein the power supplied during the etching is greater than that during the deposition.

3. A method of etching a feature in a substrate, comprising:

conducting a switched process cycle in which a deposition step and an etch step are cyclically executed within a chamber containing the substrate, wherein the switched process cycle includes alternately and repeatedly introducing an etch gas and a deposition gas into the chamber through the at least one gas inlet, wherein the deposition gas is different than the etch gas, wherein the deposition gas is for the deposition step of each cycle in which a passivation layer is deposited on the substrate and the etch gas is for the etch step of each cycle in which the passivation layer is selectively removed;

striking a plasma into the etch gas and the deposition gas alternately introduced into the chamber, the plasma having an ion flux therefrom;

partially reducing the ion flux from the plasma to obtain attenuated plasma in which sufficient ions are available to selectively remove the passivation layer during the etch step of each cycle; and accelerating the available ions onto the substrate.

* * * * *